(12) United States Patent  
Bartola

(10) Patent No.: US 6,208,210 B1
(45) Date of Patent: Mar. 27, 2001

(54) ADVANCED HYBRID POWER AMPLIFIER DESIGN

(75) Inventor: Robert D. Bartola, Pottstown, PA (US)

(73) Assignee: Ericsson Inc., Richardson, TX (US)

( * ) Notice: Subject to any disclaimer, the term of this patent is extended or adjusted under 35 U.S.C. 154(b) by 0 days.

(21) Appl. No.: 09/288,054

(22) Filed: Apr. 7, 1999

(51) Int. Cl.[7] ........................................ H03F 3/60
(52) U.S. Cl. ................................ 330/286; 330/295
(58) Field of Search ........................ 330/286, 295, 330/307

(56) References Cited

U.S. PATENT DOCUMENTS 5,392,152 * 2/1995 Higgins et al. .................... 359/333
5,469,108 * 11/1995 Tserng ............................... 330/286
5,945,700 * 8/1999 Mizutani ............................ 257/259
5,986,518 * 11/1999 Dougherty .......................... 333/117

* cited by examiner

Primary Examiner—Robert Pascal
Assistant Examiner—Henry Choe
(74) Attorney, Agent, or Firm—Arthur I. Navarro; Gary C. Honeycutt

(57) ABSTRACT

A hybrid radio frequency (RF) power device is provided which comprises: a flange (10) and an arrangement of die blocks (30) disposed about the flange (10), where the arrangement of die blocks (30) has die blocks (30a–30d) organized in a plurality of rows and a plurality columns, where the device may further comprise a substrate (15) disposed between the flange (10) and the arrangement of die blocks (30), and a first die block (30a) connected to a second die block (30b) by a conductor (42c) having a length of half a wavelength.

9 Claims, 2 Drawing Sheets

ADVANCED HYBRID POWER AMPLIFIER DESIGN

TECHNICAL FIELD

The present invention relates generally to radio frequency (RF) transmission devices, and more specifically to designs for a hybrid power devices, such as amplifiers, adapted for use in RF devices, and to a method of arranging die on a hybrid power device flange.

BACKGROUND OF THE INVENTION

Hybrid power devices are used in many electronic designs. For example, radio frequency communications devices, such as cellular telecommunications devices, use hybrid power devices such as hybrid power amplifiers. As cellular telecommunications devices offer users a wider array of features, more circuitry is needed to implement these features, and thus a demand for more powerful hybrid amplifiers has arisen. For example, in 1997 radio frequency devices typically employed a hybrid amplifier that provided from 10 to 30 Watts of power. However, by the end of 1998, engineers were designing devices that were demanding hybrid power amplifiers which could provide power in the range of 80–120 Watts of power, and it was apparent that even more powerful amplifiers would be required in the near future to accommodate even more telecommunications features.

Power amplification in a hybrid power amplifier is accomplished through the use of hybrid transistors that are also called cells. The power output of a single cell is limited, and so to increase the power output of a hybrid power amplifier, more cells must be used in a device. The clustering or grouping of cells into a concentrated area forms what is called a die. A die may consist of any number of cells (a grouping of, for example, 28 cells is common), and groupings of cells are generally made to achieve a discrete and predictable amount of power amplification (gain).

Typically, a die is arranged in a modular unit that includes the necessary mechanical and electrical connections that link the cells to appropriate points on a hybrid power amplifier, as well as to various devices that adjust an input and an output impedance. The various devices which adjust the input and output impedance include capacitors, resistors, and connections such as wire bonds, that are chosen, in part, for their impedance. The modular unit that includes the combination of the die, it's connections, and the various devices is called a "die block." Like cells, die blocks may be grouped together (effectively increasing the number of cells) on a flange to increase the power output of a hybrid power amplifier.

FIG. 1 (prior art) illustrates a common die block 30. Generally, the die block 30 receives an input signal on input connection 32, passes the input signal from the input connection 32 through die a 38, where the input signal is processed, so that an amplified output signal may be carried from the die block 30 on output connection 33.

More specifically, input connection 32 is a conductor which is electrically connected to a metal oxide semiconductor (MOS) CAP 34 that is in turn electrically linked to a plurality of conductors called wire bonds 36 that are coupled to, and carry the input signal to, the die 38. Both the MOS CAP 34 and the wire bonds 36 bias the input impedance to match the input impedance of the die 38. The die 38 is in turn coupled to conductors called output wire bonds 37 that are connected to an output MOS CAP 35 which then is linked to the output connection 33. As was the case on the input side of the die block, the output wire bonds 37 and the output MOS CAP 35 are used to adjust the output impedance of the die block 30.

Accordingly, in operation, an input signal arrives to the die block 30 at input connection 32. The input signal travels through input connection 32 to the MOS CAP 34 that bridges the input signal to the wire bonds 36 (which function as a bias circuit by adjusting the input impedance of the circuit). Next, the input signal is then passed through the wire bonds 36 to the die 38. In the die 38 the input signal causes the die to produce an output signal which is equal to the input signal multiplied by a predetermined gain. The output signal (power output) is generated in the output wire bonds 37, and the output wire bonds 37 carry the output signal to output MOS CAP 35. Like the MOS CAP 34, the output MOS CAP 35 adjusts the output impedance of the die block 30 to more closely match the output impedance of the circuit (not shown) to which the die block 30 is connected. From the MOS CAP 35, the output signal travels off the die block 30 on the output connection 33.

FIG. 2 (prior art) illustrates a hybrid power amplifier built on a flange 10 having two die blocks 30 mounted thereon. The flange 10 has mountings 12 or other means for connecting the flange 10 to its parent RF device (not shown), which may be, for example, a cellular telephone. The flange 10 supports a substrate 15 on which various structures are disposed. For example, the flange 10 may support a bias circuit 20 comprising various resistors, capacitors and other electrical devices used to adjust the input and output impedance of the hybrid power amplifier to match the input and output impedance of the circuit to which the hybrid power amplifier is attached. The bias circuit 20 may be placed on or off the flange 10, and is illustrated in FIG. 2 as being on the flange 10 (the bias circuit 20 is represented generally as a dashed block 20 to emphasize that it may be placed on or off the flange 10). In addition, the flange 10 supports die blocks 30 (each die block 30 is shown here as a rectangle, with a dark line representing the general orientation of the die 38 in a die block 30). The flange 10 also supports additional structures, such as input/output conductors called an input pin 40 and an output pin 41, and conductors called an input transmission line 42 and an output transmission line 43. The input pin 40 and input transmission line are electrically linked. Likewise, the output pin 41 and the output transmission line 43 are also electrically coupled. The input transmission line 42, and output transmission line 43, are also coupled to the die blocks 30.

In operation, input pin 40 carries an input signal to the input transmission line 42 which then transfers the input signal to die blocks 30. The input pin 40 and the input transmission line 42 may also bias the hybrid power amplifier to match the input impedance of the circuit to which the hybrid power amplifier is connected (not shown). After processing the input signal, die blocks 30 produce the output signal. The output signal travels from the die blocks 30 to output transmission line 43, which then sends the output signal to output pin 41. The output signal travels off the flange 10 through output pin 41. Note that the die 38 on the hybrid power amplifier (and the corresponding die blocks 30) are separated by a distance $S_1$. Note further that die blocks 30 are arranged in a single column down a vertical axis, here called the "y" axis. In this orientation, a signal "travels" generally in a horizontal path along a horizontal "x" axis, which is illustrated as a left to right travel path in FIG. 2.

As discussed above, to implement more powerful hybrid power amplifiers, more cells must be placed on each flange.

Increasing the number of cells on a flange is accomplished by using larger die blocks, or by placing more die blocks on a flange. To place more die blocks on a flange, designers have taken the approach shown in FIG. 3.

FIG. 3 (prior art) illustrates a flange 10 having four die blocks 30 disposed thereon in an "in-line" arrangement. This arrangement is called "in-line" because the die blocks are arranged in a vertical line along the y-axis. The in-line flange arrangement of FIG. 3 is structurally similar to the flange arrangement FIG. 1 in that it is designed to amplify an electrical signal propagating generally from input pin 40 through the die block 30 and off the flange 10 via output pin 41. The in-line arrangement of die blocks 30 shown in FIG. 3 provides for simplicity in the design and manufacture of a hybrid power amplifier. However, the vertical in-line arrangement of the die blocks 30 across the flange 10 place the die blocks 30 in close proximity to a first perimeter 22 and a second perimeter 24. In addition, the distance between the die blocks 30 has now decreased as shown by spacing $S_2$.

The design of FIG. 3, where die are arranged vertically on a flange, suffers several shortcomings. First, there is not enough vertical space to continue mounting additional die on the flange in the in-line arrangement, and thus, the total power output of a die seems to be mechanically limited by the vertical height (or length) of the flange 10.

Second, in operation, each cell typically generates a discrete amount of heat, and the decreased spacing between die, as indicated by $S_2$, results in die concentrating (which means that there is less flange area between the die to be used for heat dissipation). Thus, die concentrating results in not only the concentration of cells for power, but also the concentrating of cells as heat sources. This causes the temperature of the die blocks to increase at the die, and causes the temperature of the flange at the die concentrations to increase as well (the flange typically drains heat through the mounts 12, which function as heat sinks), which may cause device failure, or even ignite the circuit. Also, though less dangerous, inefficient heat dissipation raises the temperature of surrounding electrical systems which reduces circuit efficiency.

Another disadvantage of the prior art is that die that are physically separated (such as the die in proximity to the perimeters) by random distances are often out of phase with each other electrically. Devices which are out of phase electrically suffer from unequal spacing conditions which leads to power cancellation, and thus, inefficient power transmission. Furthermore, the disadvantages of poor heat dissipation and inefficient power transmission in hybrid power devices have the consequence of reducing the bandwidth performance of the hybrid power devices.

Therefore, there exists the need for an advanced hybrid power device and method that are capable of accommodating more power amplification per flange area. The present invention provides such a device and method.

SUMMARY OF THE INVENTION

In one embodiment, the present invention is a hybrid radio frequency (RF) power device comprising a flange and an arrangement of die blocks organized about the flange in a plurality of rows and a plurality columns. The device may further comprising a substrate disposed between the flange and the arrangement of die blocks.

The arrangement of die blocks may comprise a first die block connected to a second die block by a conductor having a length which is a fraction of a wavelength of a RF power device operation wavelength, such as one half of a wavelength. The hybrid RF power device may incorporate a Wilkerson hybrid in an input connection. In addition, the die blocks may be organized into two rows and three columns.

One embodiment of the present invention provides a hybrid RF power device having a first row and a second row and a first column and a second column. In this embodiment, an arrangement of die blocks comprises a first die block located in the first row and the first column, a second die block located in the first row and the second column, a third die block located in the second row and the first column, and a fourth die block located in the second row and the second column. Each die block has a corresponding die block input and a corresponding die block output. This embodiment may further comprise an input connection for connecting an input pin to the first die block input, the second die block input, the third die block input, and the fourth die block input where a first portion of the input connection lies generally between the first row and a first perimeter of a substrate, and a second portion of the input connection lies generally between the second row and a second perimeter of a substrate. This embodiment may also provide for an output connection for connecting an output pin to the first die block output, to the second die block output, to the third die block output, and to the fourth die block output.

The embodiment may further provide for a first link, having a length of approximately one half of a wavelength of a RF power device operation wavelength, that connects the first die block to the second die block. A second link, having a length of approximately one half of a wavelength of a RF power device operation wavelength, connects the third die block to the fourth die block. The input connection could be a microstrip transmission line.

The embodiments of the device discussed above may be made or used based on die arrangements, rather than die block arrangements. In other words, the die blocks in the embodiments summarized above can be replaced by the die components of the die blocks.

The present invention is also a method of increasing the RF power output of a hybrid power device. The method comprises the step of arranging a plurality of die blocks on a flange into a plurality of rows and a plurality columns. This method may further include the step of connecting a first die block to a second die block with a microstrip transmission line having a length of half of a wave length of a RF power device operation wavelength.

The present invention increases the available output power per a fixed flange area. The thermal dissipation of the present advanced hybrid power amplifier design is more efficient than prior art thermal dissipation because the spacing between die can be increased, providing more flange area for thermal conductivity. The present invention achieves additional efficiencies when implemented with a half-wavelength spacing between die because such a spacing eliminates the unequal phase condition problem of the prior art and has the added benefit of generating a push-pull effect in the hybrid power amplifier. Furthermore, the geometric arrangement of die block disclosed herein allows greater numbers of die to be mounted per fixed flange area, resulting in the ability to simultaneously increase the power output, realize better thermal dissipation, and achieve the desired push-pull effect. Because of these and other advantages, the present invention will achieve a higher bandwidth performance.

BRIEF DESCRIPTION OF THE DRAWINGS

Other aspects of the invention, including specific embodiments, are understood by reference to the following detailed description taken in conjunction with the drawings, in which.

Corresponding numerals and symbols in the different figures refer to corresponding parts unless otherwise indicated.

DETAILED DESCRIPTION OF PREFERRED EMBODIMENTS

Figure 4:
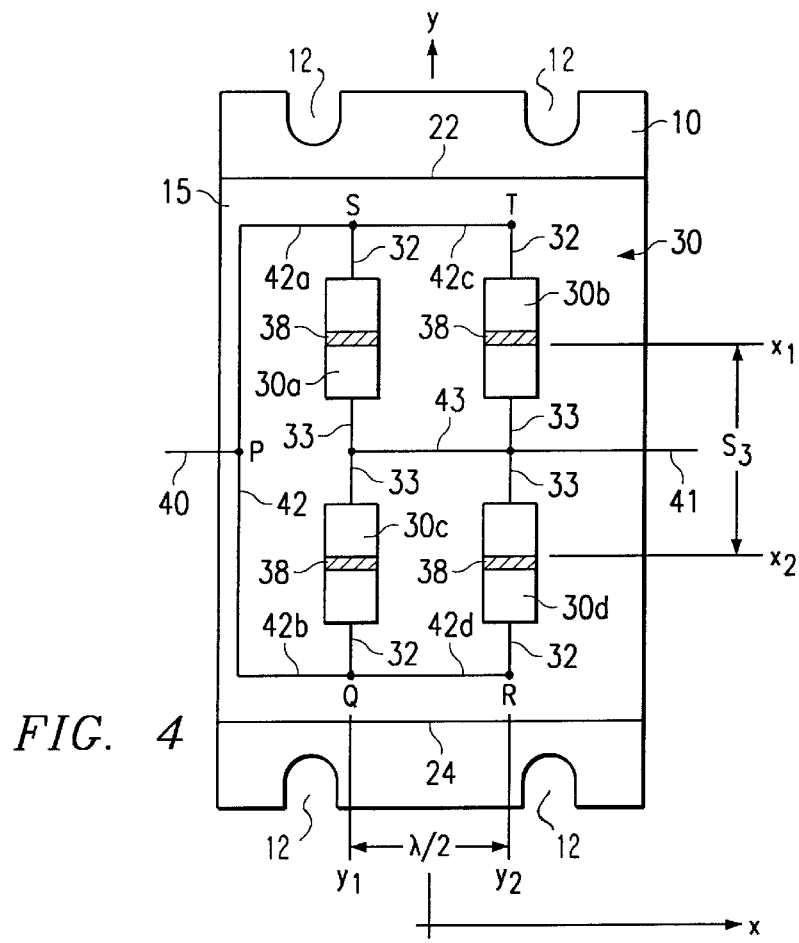
FIG. 4 illustrates one embodiment of a radio frequency (RF) hybrid power device according to the teaching of the present invention.

FIG. 4 illustrates one embodiment of a radio frequency (RF) hybrid power device according to the teachings of the present invention. The device of FIG. 4 is a hybrid RF power amplifier having an arrangement of die blocks 30, comprised of a first die block 30a, a second die block 30b, a third die block 30c, and a fourth die block 30d, disposed, in two rows and two columns, on a flange 10. The present invention does not require the alteration of the die blocks 30a–30d, as used by the prior art hybrid RF power devices, and it may be noted that the die blocks 30a–30d are generally comprised of silicon, gallium, or arsenic cells. Also, flanges, such as flange 10, are available in a wide variety of designs and sizes, and any flange configured for hybrid RF power transmission can be used with the present invention. The flange 10 has mountings 12 for securing the device to a structure, such as a cell phone.

A substrate 15 is shown disposed between the arrangement of die blocks 30 and the flange 10. The substrate 15 may be any hybrid power device substrate material, and is preferably an aluminous substrate. To more clearly present the arrangement of the die blocks 30, the flange 10 is shown illustrated along a vertical "y" axis and a horizontal "x" axis.

As illustrated in FIG. 4 the first die block 30a and the second die block 30b are physically aligned in a first horizontal row, illustrated generally as $x_1$. Accordingly, the third die block 30c and the fourth die block 30d are likewise situated along a second horizontal row, $x_2$. Furthermore, first die block 30a and third die block 30c are commonly placed in a first vertical column which is illustrated generally as $y_1$. The second die block 30b and the fourth die block 30d are commonly placed in a second vertical column, $y_2$. The die blocks 30a, 30b, 30c, 30d, are oriented so that the input connections 32 are adjacent to either a nearest substrate perimeter. Thus, first die block 30a and second die block 30b have input connections 32 which are adjacent to a first substrate perimeter 22. Likewise, the third die block 30c and the fourth die block 30d have input connections 32 which are adjacent to a second substrate perimeter 24.

The device of FIG. 4 also includes the electrical connections and devices used to carry input signals arriving at the device to the die blocks 30a–30d, as well as the electrical connections and devices used to carry output signals from the die blocks 30a–30d and off the device. Thus, to carry electrical signals into the device, the device has an input pin 40 attached to a first node P. Node P is the connection between input pin 40 and a conductive input transmission line implemented in this embodiment as an input microstrip transmission line 42. Input microstrip transmission line 42 is disposed on substrate 15 and is coupled to each die block 30a–30d through the input connections 23 of each die block 30a–30d. Likewise, to carry signals off of the device, the device also includes an output pin 41 which connects to an output transmission line implemented as an output microstrip transmission line 43. As shown in FIG. 4, the output microstrip transmission line 43 is coupled to the die blocks 30a–30d through the output connections 33.

The input microstrip transmission line 42 may implement a Wilkinson hybrid (typically realized by electrically separating the first node P from the first die block 30a, and the second die block 30c, by a distance equal to the length of one-fourth the wavelength of the operational wavelength of the device). Furthermore, as illustrated in FIG. 4, the input microstrip transmission line 42 has a link portion 42a adjacent to and approximately parallel with the first substrate perimeter 22, and a link 42c defined as the input microstrip transmission line portion between a fourth node S and a fifth node T, where the fourth node S is the electrical connection between the input connection of the first die block 30a and the input microstrip transmission line 42, and the fifth node T is the electrical connection between the second input connection of the second die block 30b and the input microstrip transmission line 42. The link 42c has a length defined as a fractional wavelength of the operational wavelength of the device. Preferably, the length of the link 42c is equivalent to half of a wavelength of the operational wavelength of the device. The preferred length of the link 42c is illustrated in FIG. 4 as lambda over 2, which is shown separating the first vertical axis $y_1$ and the second vertical axis $y_2$.

Likewise, the input microstrip transmission line 42 has a link 42b adjacent to and approximately parallel with the substrate perimeter 24, and a second link 42d defined as the input microstrip transmission line portion between the second node Q and the third node R, where the second node Q is the electrical connection between the input connection of the third die block 30c and the input microstrip transmission line 42, and the third node R is the electrical connection between the input connection of the fourth die block 30d and the input microstrip transmission line 42. The link 42d has a length defined as a fractional wavelength of the operational wavelength of the device. Preferably, the length of the link 42d is equivalent to half of a wavelength of the operational wavelength of the device. As with the first portion, the preferred length of the link 42d is illustrated in FIG. 4 as lambda over 2, which is shown separating the first vertical axis $y_1$, and the second vertical axis $Y_2$.

Note also that a half-wavelength separation of die blocks is also implemented on the output microstrip transmission line 43 of the die blocks 30a–30d. Thus, the preferred length of the output microstrip transmission line 43, which is maintained between the output connections 33 of the die blocks 30a–30d as shown in FIG. 4, is a half of a wavelength of the operational wavelength of the device. Furthermore, the output pin 41 connects to the output microstrip transmission line 43 where the output microstrip transmission line 43 intersects with the output connections 33 of the second die block 30b and the fourth die block 30d.

The half wavelength design utilized by the link 42c and the link 42d is called an impedance repeater. The impedance repeater design effectively places selective groups of die blocks, and thus, their respective die, in parallel electrically, while allowing for the physical separation of die blocks across a flange. Specifically, referring to FIG. 4, die blocks 30a and 30b are physically separated but electrically in parallel, and die blocks 30c and 30d are physically separated but electrically in parallel. Furthermore, the half wavelength design on the inputs and outputs allows the die blocks to function as push-pull amplifiers, increasing the quality of the power transmission. Specifically, die block 30a is 180 degrees out of phase with die block and 30b, and die block 30c is 180 degrees out of phase with die block 30d. Accordingly, die blocks 30a and 30c are in phase with each other (and thus, turn on together), and die blocks 30b and 30d are in phase with each other (and likewise turn on together). Thus, die blocks 30a and 30c can be said to have a push-pull effect with respect to die blocks 30b and 30d. Furthermore, because of the half wavelength design of the output microstrip transmission line 43, the output of the die blocks 30a and 30b combine with the output of die blocks 30b and 30d at the output pin 41 such that output signal of the amplifier is an amplified version of the input signal. Note that other wave length portions can be used. Furthermore, it is worth noting that the half wavelength design also naturally suppresses even order harmonic interference.

In operation, input pin 40 carries an input signal to input microstrip transmission line 42 which relays the input signal on to die blocks 30a, 30b, 30c, and 30d. The input pin 40 and the input microstrip transmission line 42 may also bias the input impedance of the hybrid power amplifier to match the input impedance of the circuit to which the hybrid power amplifier is connected (not shown). After processing the input signal, die blocks 30a–30d produce the output signal and send the output signal to the output microstrip transmission line 43. The output microstrip transmission line 43 then sends the output signal to the output pin 41 which carries the output signal off the flange. In the orientation of the present invention, an electrical signal travels generally in a horizontal path along a horizontal "x" axis from left to right, and thus provides for mechanical operation which is transparent to a user of the prior art devices.

The orientation of the die blocks 30a–30d into rows $x_1$, $x_2$ and columns $y_1$, $y_2$ as demonstrated by die blocks 30a, 30b 30c, and 30d, permits more die blocks to be placed on a fixed flange area (making more powerful devices possible). The arrangement of die blocks into rows and columns makes the placement of a specific number of die blocks on a fixed flange area easier than in-line placement. Furthermore, the orientation of the die blocks into rows and columns provides for an increased separation, shown in FIG. 4 as $S_3$, of the die of the die blocks, as compared to a prior art design having the same number of die blocks, for example, $S_2$ in FIG. 3. The physical separation of the die 38 of the die blocks 30a–30d in this manner provides thermal dissipation advantages. This increased separation means that the heat generated by the die 38 is spread out (as opposed to the heat being concentrated in a small area, as is a problem with the in-line arrangement separation, $S_2$, shown in FIG. 3). In fact, some designs limit available RF power output because of the heat generated due to the higher die temperatures of the prior art.

Another advantage of this configuration is that it is easier to match a lower die impedance. Because the die blocks are effectively operating in pairs (for example, 30a and 30b are operating as a pair, and 30c and 30d are operating as a pair), a lower transformation ratio is needed for a fixed flange space to match the impedance of a network. In other words, in operation, the present invention sees the network not as from the point of view of four die blocks in parallel, but from the point of view of two pairs of die blocks operating in parallel. This lower transformation ratio improves the bias of the device which also increases the active bandwidth of the device.

The physical separation of die 38 also eliminates the problem of power cancellation encountered by the prior art in-line design. Power cancellation in the prior art is caused by the unequal phase conditions which exist at the output connections of the prior art in-line design. This is because the die blocks of the in-line approach are separated by distances that force the choice of selecting more die on the flange, better heat dissipation, or better phase placement. Also, the present invention realizes less phase shift on the die block inputs as well as better heat dissipation. Accordingly, the present invention harmonizes competing inconsistencies of the prior art to produce both heat dissipation and phase harmonization benefits that result in lower overall power loss.

Figure 1:
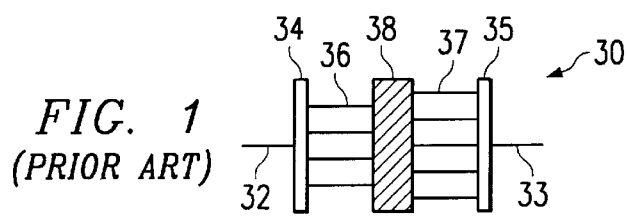
FIG. 1 (prior art) illustrates a common die block.
Figure 2:
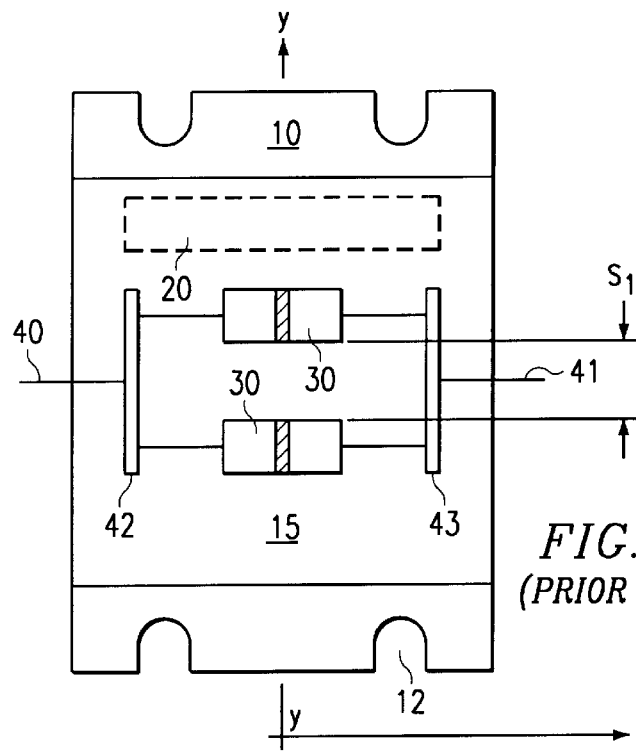
FIG. 2 (prior art) illustrates a hybrid power amplifier built on a flange with two die blocks mounted thereon.
Figure 3:
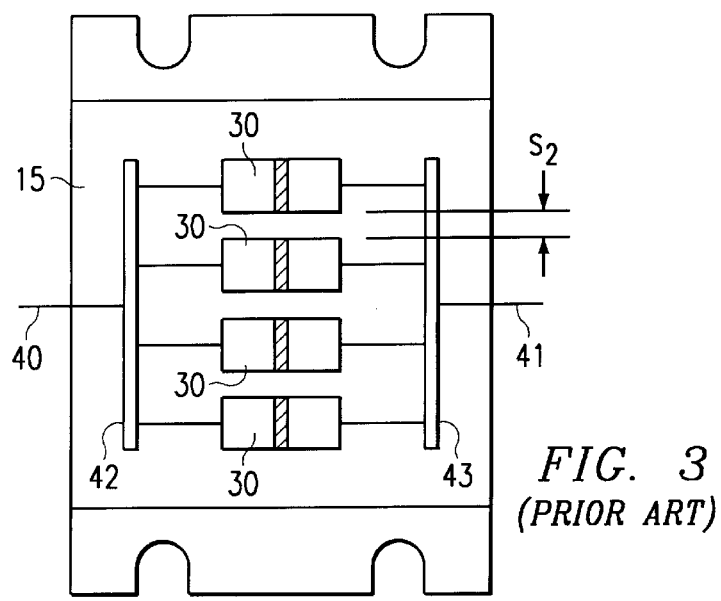
FIG. 3 (prior art) illustrates a flange having four die blocks hereon.
Figure 5:
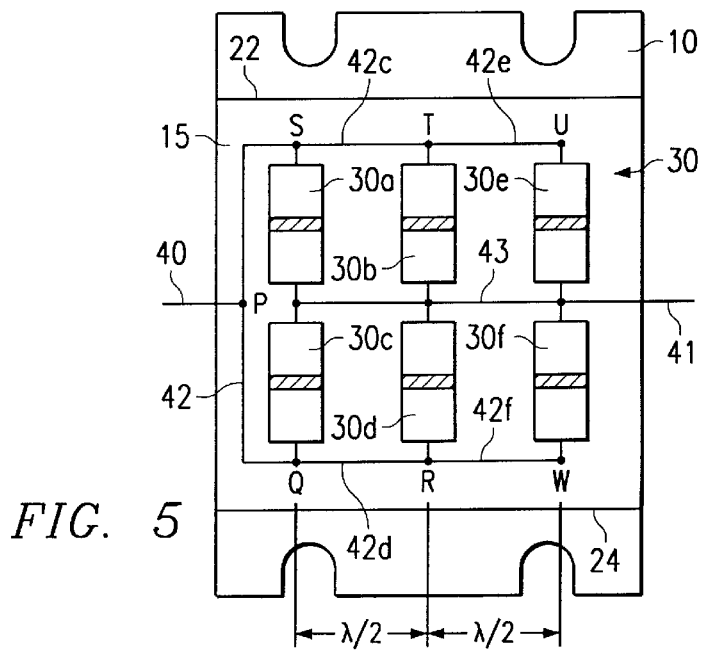
FIG. 5 portrays one embodiment of the present invention that accommodates multiple die blocks in a cascaded format.

Of course, it may be desired to add additional die blocks to a flange in a manner that embraces the advantages of the present invention. FIG. 5 portrays one embodiment of the present invention that accommodates multiple die blocks in a cascaded format, here incorporating a fifth die block 30e and a sixth die block 30f. The embodiment of FIG. 5 realizes the spacing advantage of the present invention. For comparative purposes, the flange sizes and substrate sizes of FIG. 3 and FIG. 5 are drawn equal. Note that the spacing limitations of the in-line configuration illustrated in FIG. 3 prohibit the placement of more than four die blocks on the flange. However, the configuration of the present invention easily accommodates six (or more) die blocks on the same flange area while taking advantage of the spacing advantages of the present invention.

Thus, FIG. 5 illustrates one embodiment of a radio frequency (RF) hybrid power amplifier according to the teachings of the present invention. The hybrid RF power amplifier has an arrangement of die blocks 30, comprised of a first die block 30a, a second die block 30b, a third die block 30c, a fourth die block 30d, the fifth die block 30e and the sixth die block 30f, disposed in two rows and three columns, on a flange 10. A substrate 15 is shown disposed between the arrangement of die blocks 30 and the flange 10.

As illustrated in FIG. 5 the first die block 30a, the second die block 30b, and the fifth die block 30e are physically aligned in a first horizontal row. Accordingly, third die block 30c, fourth die block 30d, and sixth die block 30f are likewise situated along a second horizontal row. Furthermore, first die block 30a and third die block 30c are commonly placed in a first vertical column. The second die block 30b and fourth die block 30d are commonly placed in a second vertical column, and the fifth die block 30e and the sixth die block 30f comprise a third vertical column. The die blocks 30a, 30b, 30c, 30d, 30e, and 30f are oriented so that the input connections 32 are adjacent to either a nearest substrate perimeter. Thus, first die block 30a, second die block 30b and fifth die block 30e have input connections 32 which are adjacent to a first substrate perimeter 22. Likewise, the third die block 30c, the fourth die block 30d, and the sixth die block 30f have input connections 32 which are adjacent to a second substrate perimeter 24.

The hybrid power amplifier of FIG. 5 also provides the electrical connections used to carry input signals arriving at the device to the die blocks 30a–30f, as well as the electrical connections to carry output signals from the die blocks 30a–30f and off the device. Thus, to carry electrical signals into the device, the device has an input pin 40 attached to a first node P. Node P is the connection between input pin 40 and a conductive input transmission line implemented in this embodiment as an input microstrip transmission line 42. Input microstrip transmission line 42 is disposed on substrate 15 and is coupled to each die block 30a–30f. Likewise, to carry signals off of the device, the device also includes an output pin 41 which connects to an output transmission line implemented as an output microstrip transmission line 43. As shown in FIG. 5, the output microstrip transmission line 43 is coupled to the die blocks 30a–30f.

Furthermore, as illustrated in FIG. 5, the input microstrip transmission line 42 has a first portion adjacent to and approximately parallel with the first substrate perimeter 22, and a first link 42c defined as the input microstrip transmission line portion between a fourth node S and a fifth node T, where the fourth node S is the electrical connection between the input connection of the first die block 30a and the input microstrip transmission line 42, and the fifth node T is the electrical connection between the second input connection of the second die block 30b and the input microstrip transmission line 42. The link 42c has a length defined as a fractional wavelength of the operational wavelength of the device. Preferably, the length of the link 42c is equivalent to half of a wavelength of the operational wavelength of the device. The preferred length of the link 42c is illustrated in FIG. 5 as lambda over 2.

Likewise, the input microstrip transmission line 42 has a link 42b adjacent to and approximately parallel with the second substrate perimeter 24, and a link 42d defined as the input microstrip transmission line portion between the second node Q and the third node R, where the second node Q is the electrical connection between the input connection of the third die block 30c and the input microstrip transmission line 42, and the third node R is the electrical connection between the input connection of the fourth die block 30d and the input microstrip transmission line 42. The link 42d is a length defined as a fractional wavelength of the operational wavelength of the device. Preferably, the length of the second portion 42d is equivalent to half of a wavelength of the operational wavelength of the device. As with the link 42d the preferred length of the second portion is illustrated in FIG. 5 as lambda over 2. Furthermore, FIG. 5 also shows a link 42e, which connects fourth node T to fifth node U, and a link 42f, which connects third node R to sixth node W. Both the link 42e and the link 42f preferably incorporate the half-wavelength design.

Note also that a half-wavelength separation of die blocks is also implemented on the output microstrip transmission line 43 of the die blocks 30a–30f. Thus, the preferred length of the output microstrip transmission line 43, which is maintained between the output connections 33 of the die blocks 30a–30f as shown in FIG. 5, is a full wavelength of the operational wavelength of the device. Furthermore, the output pin 41 connects to the output microstrip transmission line 43 where the output microstrip transmission line 43 intersects with the output connections 33 of the fifth die block 30e and the sixth die block 30f.

Thus, the present invention separates die blocks into a plurality of rows and a plurality of columns. Arranging die blocks in a plurality of rows and columns allows for an increased die spacing. The increased die spacing provides the ability to place more die on a fixed flange area (thus, more powerful devices for a fixed flange size), and for better heat spreading. Furthermore, in one embodiment, die blocks are connected by a conductor having a length which is preferably equal to one half of the operating wavelength of the circuit. The half wavelength separation of the die blocks provides for a push-pull amplifier effect. In addition, a Wilkinson hybrid on the device input and the half wavelength separation of die blocks make easier the matching of the device impedance to the impedance of the remainder of the circuit.

While the invention has been described in conjunction with preferred embodiments, it should be understood that modifications will become apparent to those of ordinary skill in the art and that such modifications are therein to be included within the scope of the invention and the following claims.

I claim:

1. A hybrid radio frequency (RF) power device comprising:
    a flange;
    an arrangement of die blocks disposed about the flange, said arrangement of die blocks organized in a plurality of rows and a plurality columns, each of said die blocks having corresponding input and output connections;
    a substrate disposed between the flange and said arrangement of die blocks;
    an input pin attached to said flange;
    an input transmission line extending between said input pin and said arrangement of die blocks;
    a first link connecting a first die block via a first input connection to a second die block via a second input connection;
    a second link connecting a third die block via a third input connection to a fourth die block via a fourth input connection;
    a third link coupling said input transmission line to said first link;
    a fourth link coupling said input transmission line to said second link;
    an output pin attached to said flange opposite said input pin; and
    an output transmission line extending between corresponding output connections of said first, second, third and fourth die blocks and said output pin;
    wherein said first and second links have a length approximately one half the RF wavelength of the operating wavelength of the power device so that die blocks in a first column of said arrangement are substantially in phase with each other and approximately 180 degrees out of phase with die blocks in a neighboring column of die of said arrangement thereby causing die in the first column to switch ON together and increase the efficiency of the RF power devise.

2. The device of claim 1 wherein said input transmission line comprises a Wilkerson hybrid.

3. The device of claim 1 wherein:
    a portion of said input transmission line lies generally between a row and a first perimeter of said substrate; and
    a portion of said input transmission line lies generally between a second row and a second perimeter of said substrate.

4. The device of claim 1 wherein the input transmission line is a micro strip transmission line.

5. The device of claim 1 wherein:
    the plurality of rows comprises at least a first row and a second row; and
    the plurality of columns comprises at least a first column, a second column, and a third column.

6. A hybrid radio frequency (RF) power device comprising:
    a flange; and
    a plurality of die predisposed about the flange and arranged into two rows and three columns, each of the die including input connections and output connections;

a substrate disposed between the flange and the die;

an input pin coupled to the flange and adapted for carrying a into the power device;

an input micro strip transmission line for connecting the input pill to the input connections of said die;

an output pin for carrying a signal from the power device;

an output micro strip transmission line for connecting the output pin to the output connections of the die; and links coupling successive input connections of die in neighboring columns, the length of said links being approximately one-half wavelength of the RF operating wavelength of the power device so that die blocks in columns 1 and 3 are in phase and 180 degrees out-of-phase with die blocks in column 2 thereby increasing the efficiency of the RF power device.

7. The device of claim 6 further comprising an input transmission line comprising a quarter-wavelength Wilkerson hybrid connected to the arrangement of die.

8. The device of claim 6 wherein:

the plurality of rows comprises a first row and a second row;

the plurality of columns comprises a first column and a second column; and the arrangement of die comprises:

a first die located in the first row and the first column, said first die having a first input connection and a first output connection;

a second die located in the first row and the second column, said second die having a second input connection and a second output connection;

a third die located in the second row and the first column, said third die having a third input connection and a third output connection; and a fourth die located in the second row and the second column, said fourth die having a fourth input connection and a fourth output connection.

9. The device of claim 8 wherein the input microstrip transmission line comprises:

a first link connecting a first input connection of a first die to a second input connection of a second die, the first link having a length of approximately one half of a wavelength of the RF power device operating wavelength; and a second link connecting a third input connection of a third die to a fourth input connection of a fourth die, the second link having a length of approximately one half of a wavelength of the RF power device operating wavelength.

* * * * *